United States Patent [19]

Seevinck

[11] Patent Number: 4,584,535

[45] Date of Patent: Apr. 22, 1986

[54] STABILIZED CURRENT-SOURCE CIRCUIT

[75] Inventor: Evert Seevinck, Delden, Netherlands

[73] Assignee: U.S. Philips Corporation, New York, N.Y.

[21] Appl. No.: 622,349

[22] Filed: Jun. 19, 1984

[30] Foreign Application Priority Data

Jun. 22, 1983 [NL] Netherlands ........................ 8302215

[51] Int. Cl.[4] ............................................. H03F 3/45

[52] U.S. Cl. .................................... 330/257; 330/288; 323/316

[58] Field of Search ................ 330/257, 288; 307/297; 323/315, 316

[56] References Cited

U.S. PATENT DOCUMENTS 4,485,341 11/1984 Welty et al. ........................ 323/315

*Primary Examiner*—James B. Mullins

*Attorney, Agent, or Firm*—Robert T. Mayer; Steven R. Biren

[57] ABSTRACT

In a current source circuit, a first and a second PNP transistor have commoned base electrodes, their emitters being connected through resistors to the positive supply voltage terminal. The collector lead of the first transistor includes a current source, which supplies a current which is reproduced at the output terminal. The commoned base electrodes are driven by a third transistor connected as an emitter follower, its emitter lead including a current source. The base of the third transistor is connected through a resistor to the positive supply voltage terminal as a result of which supply voltage variations appear also at the commoned bases of the first and second transistors so that the output current at the output terminal is substantially independent of supply voltage variations. A differential amplifier comprising fourth and fifth transistors, in which the base of the fourth transistor is connected to the collector of the first transistor and the base of the fifth transistor is connected to a reference voltage, controls the voltage at the base of the third transistor so that the collector current of the first transistor is substantially equal to the current of the current source.

5 Claims, 5 Drawing Figures

STABILIZED CURRENT-SOURCE CIRCUIT

BACKGROUND OF THE INVENTION

The invention relates to a current source circuit arrangement comprising a first current path extending between a first terminal and a common terminal and including a current source and the collector-emitter path of a first transistor, and a second current path extending between a second terminal and the common terminal and including the collector-emitter path of a second transistor, which has a base electrode commoned with the base electrode of the first transistor and is of the same conductivity type as the first transistor.

Such current source circuit arrangements, which are also called current mirror circuits, are frequently used in electronic circuit arrangements. These current source circuit arrangements can be used especially in integrated power amplifiers for audio applications.

In the simplest form of such a current source circuit arrangement, the first transistor in the first current path is connected as a diode. When the first and the second transistor are identical, the current flowing through the second current path is substantially equal to that flowing through the first current path because, due to the commoned base electrodes, the base-emitter voltages of the two transistors are equal. The current in the second current path can also be made larger or smaller than the current in the first current path by scaling the emitter areas of the first and second transistors or by including unequal resistors in the emitter leads of the first and second transistors. By adding a transistor, the current in the second current path can be made more equal to the current in the first current path. In one version of this configuration, the base current of the first and second transistors can then be supplied by a further transistor, whose emitter is coupled to the commoned base electrodes of the first and second transistors and whose base electrode is coupled to the collector of the first transistor.

Further, additional output currents can be obtained by connecting transistors with their base-emitter paths in parallel with the base-emitter path of the second transistor.

In such current source circuit arrangements, however, the current in the second current path strongly depends upon variations in the voltage at the common terminal which is usually connected to the positive or negative supply voltage. There is present between the commoned base electrodes and ground (the substrate in the case of an integrated circuit) a parasitic capacitance which constitutes a shortcircuit for high frequencies. This is especially the case for lateral pnp transistors, in which the base is constituted by an epi region which has a comparatively large parasitic capacitance C to the substrate. In the case when the current source circuit arrangement of the kind described is provided with a further transistor, this effect is increased by the presence of the parasitic capacitance between the base electrode of this further transistor and the substrate. As seen at the emitter of this further transistor and consequently at the commoned base electrodes of the first and second transistors, this capacitance has an apparent value, which is $\beta+1$ times larger than its actual value $\beta$ being the current amplification factor of this transistor. Variations of the voltage at the common terminal, for example in the form of an alternating voltage modulated onto the supply voltage, result due to these parasitic capacitances in variations of the base emitter voltages of the first and second transistors, which in turn lead to variations of the current in the second circuit.

Variations of the voltage at the common terminal result in variations of the output currents of the current source circuit arrangement, which may adversely affect the operation of circuitry to which it is connected. One of the applications in which this influence gives rise to problems is that of integrated power amplifiers in which so-called "bootstrapping" is utilized for obtaining a large dynamic range from the output transistors. Such an amplifier is, for example, the integrated circuit of the type TDA 1015 described in Philips Data Handbook "Integrated Circuits", Part 1, January 1983. In such an amplifier, a so-called bootstrap line is connected through a resistor to the positive voltage supply line. Current source circuit arrangements of the kind described may then be used inter alia as a load for the drive amplifier for the output stage and as a current source for the bias current adjustment of the output stage. The common terminal of the current source circuit arrangement is then connected to the bootstrap line. The larger dynamic range from the output transistors is obtained since the alternating voltage signal at the output of the amplifier is passed via a bootstrap capacitance to the bootstrap line. Due to the presence of the parasitic capacitances, however, the current from the current source circuit arrangement will then also comprise an alternating current component which is converted at the high impedance input of the output stage into a comparatively large alternating voltage, which in turn appears at the output of the output stage. The signal has then traversed a positive feedback loop. At a frequency determined by the value of the parasitic capacitances of the current source circuit arrangement the loop amplification becomes higher than unity, as a result of which instabilities and oscillations occur.

It is known to avoid these effects by connecting a capacitance in parallel with the resistor between the voltage supply line and the bootstrap line, as a result of which the bootstrap line potential is smoothed for high frequencies. However, this capacitor should have a capacitance of a few hundred nF, so that it cannot be integrated, which results in additional cost due to the required additional connection to the integrated circuit. Further, this capacitor leads to an increase in the interference radiation from the integrated circuit.

Another known method of avoiding these instabilities and oscillations is to connect the compensation capacitance, which also for reasons of stability is generally arranged between the output of the output stage and the input of the drive stage, not to the output, but to the input of the output stage. Thus, for high frequencies the input impedance of the output stage is very much decreased, so that the alternating current component of the current source circuit arrangement can find a low-impedance path to ground. However, when the input of the output stage becomes low-impedance, the disadvantage occurs that the so-called "cross-over distortion" is adversely affected for high frequencies. Further, the signal path via the current source for the bias current adjustment is still present so that instabilities can continue to occur.

SUMMARY OF THE INVENTION

Therefore, the invention has for its object to provide a current source circuit arrangement in which the output currents are substantially independent of variations of the voltage at the common terminal of the transistors of the circuit arrangement. The invention further has for its object to provide such a current source circuit arrangement which can be entirely integrated.

According to the invention, a current source circuit arrangement of a kind set forth above is characterized in that the commoned base electrodes of the first and second transistors are controlled by a third transistor which is connected as an emitter follower, has a conductivity type opposite to that of the first and second transistors and whose base electrode is coupled through an impedance element to the common terminal. The invention is based on the recognition of the fact that the commoned base electrodes have to follow the variations of the voltage at the common terminal in order to avoid variations of the output current of the current source circuit arrangement. The voltage variations at the common terminal appear via the impedance element, for example a resistor, at the base electrode of the third transistor and hence, due to the emitter follower effect, also at the common base electrodes of the first and second transistors.

The arrangement may be further characterized in that there is arranged between the collector of the first transistor and the base electrode of the third transistor a control loop which controls the voltage at the base electrode of the third transistor so that the collector current of the first transistor is substantially equal to the current from the current source. The voltage at the base electrode of the third transistor defines the base-emitter voltage and hence the collector current of the first transistor. It is ensured by the control loop that the collector current of the first transistor is substantially equal to the current from the current source. This can alternatively be achieved by arranging the emitter leads of the first and second transistors to have a junction which is connected through a resistor to the common terminal, with a control loop arranged between the collector of the first transistor and the junction of the emitter leads of the first and second transistors.

BRIEF DESCRIPTION OF THE DRAWING

The invention will be described more fully, by way of example, with reference to the accompanying drawing in which.

DESCRIPTION OF THE PREFERRED EMBODIMENTS

Figure 1:
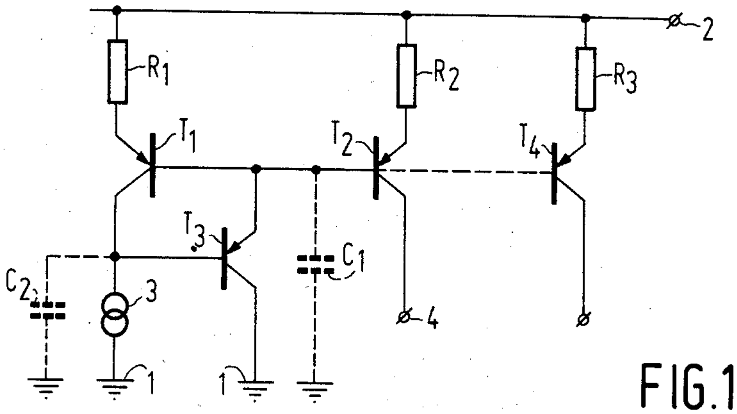
FIG. 1 PRIOR ART
FIG. 1 shows a known current source circuit arrangement.

FIG. 1 shows a current source circuit arrangement according to the prior art. The arrangement is constituted by a first current path extending between a terminal 1, in this case ground, and a common terminal 2, which in this case is the positive supply voltage line, and a second current path extending between a second terminal 4 and the common terminal 2. The first path comprises the series arrangement of a current source 3, the collector-emitter path of a PNP transistor $T_1$ and a resistor $R_1$. The term "current source" is to be understood to mean in this application a current supply element having a high impedance. The second path is constituted by the series arrangement of the collector-emitter path of a PNP transistor $T_2$ and a resistor $R_2$. The transistor $T_2$ has a base which is commoned with that of the transistor $T_1$. The third PNP transistor $T_3$ is connected with its base-emitter junction between the collector of $T_1$ and the commoned bases of $T_1$ and $T_2$, while its collector is connected to the ground terminal 1. As is known, when the transistors $T_1$ and $T_2$ are identical, as are the resistors $R_1$ and $R_2$, the current in the second current path is substantially equal to the current from the current source 3. The ratio between the currents in the first and second circuits can be adjusted by adjusting the ratio between the resistors $R_1$ and $R_2$. The current source circuit arrangement can be provided with additional current outputs by connecting the bases of additional transistors to the common base electrode of $T_1$ and $T_2$ and by connecting their emitters via respective resistors to the common terminal 2. In the Figure, this is represented by the transistor $T_4$ and the resistor $R_3$. A parasitic capacitance $C_1$ is present between the commoned bases of $T_1$ and $T_2$ and the ground terminal 1, generally the substrate of the integrated circuit, while a parasitic capacitance $C_2$ is present between the base of the transistor $T_3$ and the ground terminal 1, which capacitances are shown in the Figure in dotted lines. The capacitance $C_2$ has, viewed from the emitter of the transmitter $T_3$ and so from the base of $T_1$ and $T_2$, an apparent value $(\beta+1)C_2$, where $\beta$ is the current amplification factor of the transistor $T_2$. With increasing frequency, the impedance of the parasitic capacitances decreases. For high frequencies these parasitic capacitances form a short circuit so that the commoned bases of the transistors $T_1$ and $T_2$ are grounded. If an alternating voltage signal is present at the supply voltage line 2, the voltage between the commoned bases and the supply voltage line will be modulated due to these parasitic capacitances. As a result, the output currents in the collector leads of the transistors $T_2$ and $T_4$ are modulated, which modulation increases with increasing frequency. Interference signals at the supply voltage line 2 consequently lead to interference currents in the output currents of the current source circuit arrangement, which may have an unfavorable influence on circuitry to which it is connected.

Figure 2:
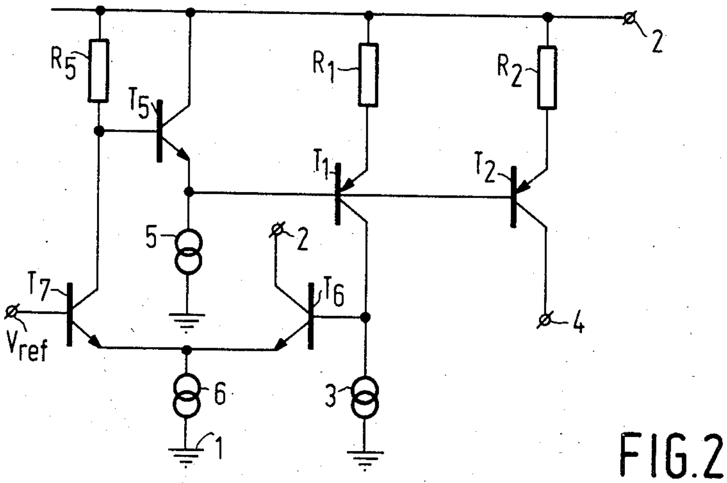
FIG. 2 shows a first embodiment of the invention.

FIG. 2 shows a first embodiment of the invention, in which the disadvantageous effects of the parasitic capacitances are substantially eliminated. Like parts are designated by the same reference numerals as in FIG. 1. The current source circuit arrangement again comprises the transistors $T_1$ and $T_2$ with commoned bases, the emitters of which are connected through resistors $R_1$ and $R_2$ to the positive supply voltage line 2, while the collector of the transistor $T_1$ is connected to the current source 3. The commoned base electrodes of the transistors $T_1$ and $T_2$ are driven by a transistor $T_5$ connected as an emitter follower, whose base is connected through a resistor $R_5$ to the positive supply voltage line 2. In the emitter lead of the transistor $T_5$ a current source 5 is provided which has to be sufficiently large to be able to supply the base currents of the transistors $T_1$ and $T_2$ and any further connected transistors. The circuit arrangement further comprises a control loop which is constituted by the transistors $T_6$ and $T_7$ connected as a differential pair, a current source 6 being included in their common emitter lead. The base of the transistor $T_6$ is connected to the collector of the transistor $T_1$, and its collector is connected to the positive supply voltage line 2. The base of the transistor $T_7$ is connected to a reference voltage $V_{ref}$ and the resistor $R_5$ is included in the collector lead of the transistor $T_7$. The reference voltage has a value such that the differential pair $T_6$, $T_7$ operates in the linear range in which the current from the current source 6 is distributed substantially uniformly between the transistors $T_6$ and $T_7$. The control loop now adjusts the differential pair $T_6$, $T_7$ so that the collector current of $T_7$ has a value such that due to the voltage drop across the resistor $R_5$, the voltage at the base of the transistor $T_5$ and hence the voltage at the base of $T_1$, $T_2$, is of such magnitude that, apart from the base current of the transistor $T_6$, the collector current of the transistor $T_1$ is substantially equal to the current from the current source 3.

If now an alternating voltage signal is present at the supply voltage line 2, this signal appears substantially in its entirety at the base of the transistor $T_5$. The resistor $R_5$ can be chosen to be a low-resistance value and is in practice a few hundred ohms. The parasitic capacitance between the bases of the transistors $T_1$, $T_2$ and ground and hence also between the emitter of the transistor $T_5$ and ground has, viewed from the base of the transistor $T_5$, an apparent value which is $\beta+1$ times smaller than its actual value, $\beta$ being the current amplification factor of the transistor $T_5$. The time constant of the combination of the resistor $R_5$ and this apparent capacitance is therefore so small that the disadvantageous influence of this capacitance is substantially eliminated. The time constant of the combination of the resistor $R_5$ and the parasitic capacitance present between the collector of the transistor $T_7$ and ground is, due to the low resistance value of $R_5$, also so small so that this capacitance also does not exert a disadvantageous influence on the output current of the current source circuit arrangement. Due to the emitter follower effect of the transistor $T_5$, the signal at the base of this transistor also appears at the commoned bases of the transistors $T_1$ and $T_2$. Thus, the voltage at the base of the transistor $T_1$ varies to the same extent as the voltage at the supply voltage line 2 so that the voltage therebetween remains constant, as a result of which the collector current of the transistor $T_2$ also remains constant.

Figure 3:
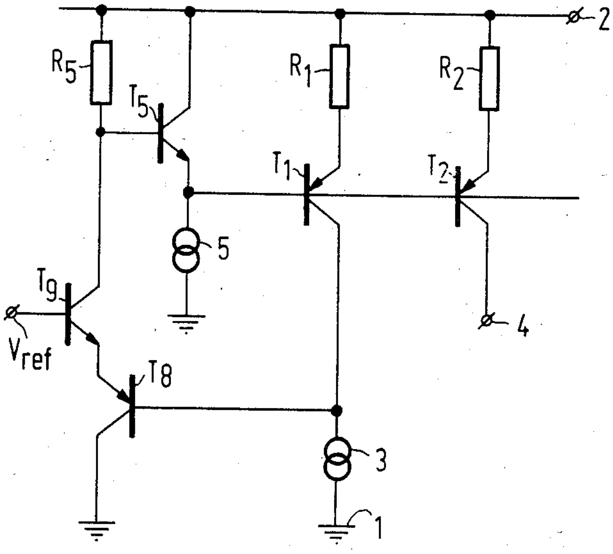
FIG. 3 shows a second embodiment of the invention.

A second embodiment of the invention is illustrated in FIG. 3, in which like parts are designated by the same reference numerals as in FIG. 2. This embodiment differs from that of FIG. 2 in that the control loop is not constituted by a differential amplifier with identical transistors, but by a differential amplifier with transistors of opposite conductivity types. The control loop includes a PNP transistor $T_8$ whose base is again connected to the collector of the transistor $T_1$ and whose collector is connected to the ground terminal 1. The emitter of the transistor $T_8$ is connected to the emitter of an NPN transistor $T_9$ whose base is connected to a reference voltage. The collector of the transistor $T_9$ is again connected to the resistor $R_5$. In principle, the control loop could comprise only the PNP transistor $T_8$. However, the parasitic capacitance between the base of the transistor $T_8$ and ground has, viewed from the emitter of $T_8$ and hence from the direction of the base of the transistor $T_5$, a $\beta+1$ times larger value than its actual value as a result of which the voltage variations at the base of the transistor $T_5$ would be smoothed. Due to the fact that the base of the transistor $T_9$ is connected to a reference voltage, the parasitic capacitance at the base of the transistor $T_8$ is decoupled from a signal occurring at the supply voltage line 2. Due to the fact that the differential amplifier comprises a PNP and an NPN transistor, the circuit arrangement can include one current source fewer as compared with the embodiment shown in FIG. 2. The control loop controls the voltage at the base of the transistor $T_5$ again so that the collector current of the transistor $T_1$ is again substantially equal to the current from the current source 3.

Figure 4:
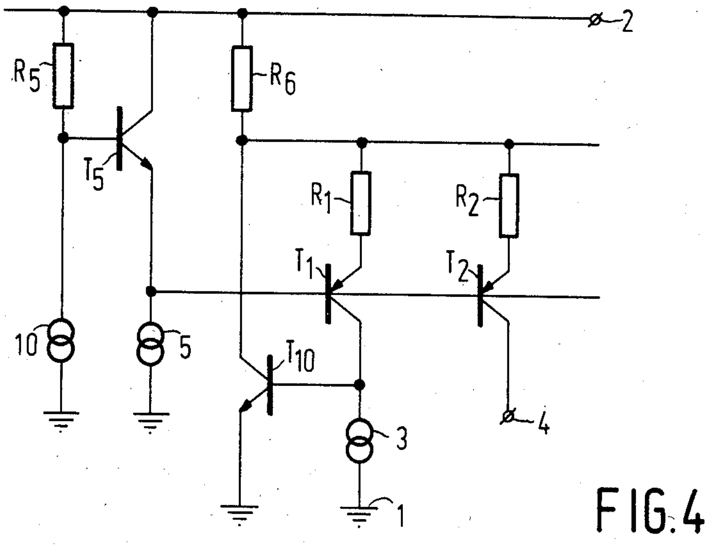
FIG. 4 shows a third embodiment of the invention.

A third embodiment of the invention will now be explained with reference to FIG. 4, in which like parts are designated by the same reference numerals as in FIG. 1. In FIG. 4 the resistor $R_5$ has connected to it a current source 10 which defines the voltage at the base of the transistor $T_5$ and hence also the voltage at the common base of the transistors $T_1$ and $T_2$. The control loop, which ensures that the collector current of the transistor $T_1$ is substantially equal to the current from the current source 3, in this case acts upon the emitter leads of the transistors $T_1$ and $T_2$. For this purpose, the resistors $R_1$ and $R_2$ in the emitter leads of the transistors $T_1$ and $T_2$ are connected not directly, but through a resistor $R_6$, to the positive supply voltage line 2. The control loop is constituted by the NPN transistor $T_{10}$, whose base is connected to the collector of the transistor $T_1$ and whose emitter is connected to ground. The collector of the transistor $T_{10}$ is coupled to the junction of the resistors $R_1$, $R_2$ and the resistor $R_6$.

Figure 5:
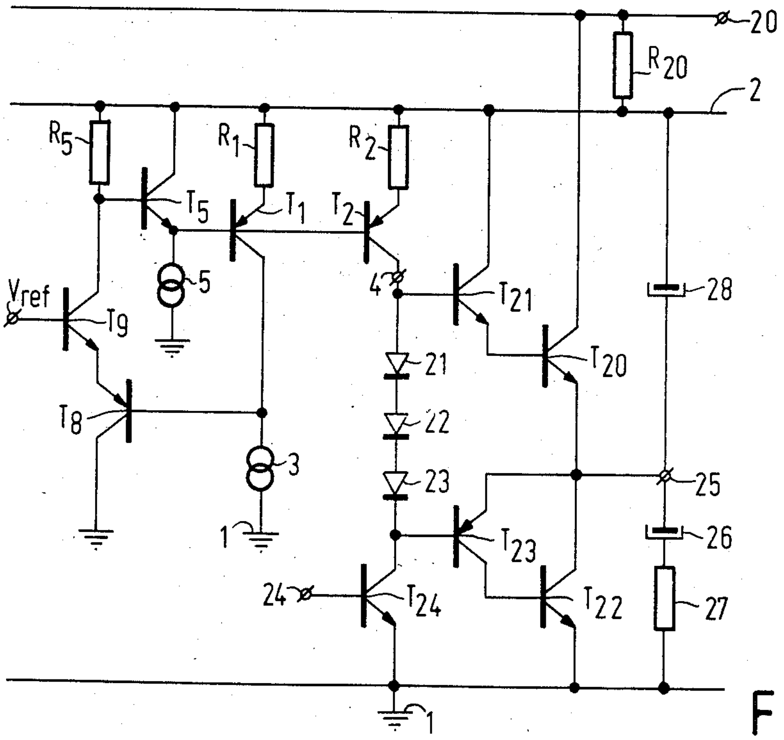
FIG. 5 shows a power amplifier provided with a current source circuit arrangement according to the invention.

FIG. 5 shows a power amplifier in which a current source circuit arrangement according to the invention is advantageously included. For the sake of clarity, a highly simplified circuit diagram of the amplifier is shown. The amplifier is provided with a quasi complementary output stage. The NPN transistor $T_{20}$ is driven by the NPN emitter follower transistor $T_{21}$, which forms together with the transistor $T_{20}$ a Darlington pair. The NPN transistor $T_{22}$ is driven by a PNP transistor $T_{23}$, which forms with the transistor $T_{22}$ a quasi PNP transistor. The bias current adjustment is obtained by means of three diodes 21, 22 and 23, through which a direct current is passed which is equal to the collector current of the transistor $T_2$. This transistor $T_2$ forms part of a current source circuit arrangement of the kind shown in FIG. 3 and like parts of this circuit arrangement are designated by the same reference numerals. The input signal is supplied to the base 24 of a voltage amplifier $T_{24}$, whose collector is connected to the diode 23 and through which then also flows a bias current which is substantially equal to the collector current of the transistor $T_2$. The amplified input signal appears at the bases of the transistors $T_{21}$ and $T_{23}$. Dependent upon the phase of the amplified signal, the transistors $T_{20}$, $T_{21}$ and $T_{22}$, $T_{23}$ are alternately conducting. The signal at the output 25 of the amplifier is supplied through a capacitor 26 to a load 27. In order to obtain a large dynamic range from the amplifier, the output signal is bootstrapped, that is to say the output signal is supplied through a bootstrap capacitor 28 to the bootstrap line 2 which is connected through a bootstrap resistor $R_{20}$ to the positive supply voltage line 20. Due to the bootstrapping, the voltage at the bootstrap line 2 and hence also the voltage at the bases of the transistors $T_{21}$ and $T_{23}$ is pulled along with the output signal up to or beyond the voltage at the supply voltage line 20. Due to the emitter follower effect of the transistor $T_5$, the voltage at the common base of the transistors $T_1$ and $T_2$ follows the voltage at the bootstrap line 2 so that the collector current of the transistor $T_2$ remains constant. If the collector current of the transistor $T_2$ were modulated in accordance with the signal at the bootstrap line 2, this modulated signal would appear at the output 25 and, via the bootstrap capacitance 28, again at the bootstrap line 2 so that this signal would have traversed a loop. As a result, instabilities and oscillations might occur. With the use of the current source circuit arrangement according to the invention, this is avoided.

The invention has been explained with reference to embodiments in which the transistors of the current source circuit arrangement are PNP transistors, whose emitters are connected through resistors to the positive supply voltage line. Apart from the fact that the circuit arrangement may alternatively have no emitter resistors, it is of course alternatively possible to provide the circuit arrangement with NPN transistors, whose emitters may be connected via resistors to the negative supply voltage line. The NPN transistors present in the circuit arrangement should then be replaced by PNP transistors.

What is claimed is:

1. A current source circuit arrangement having a first terminal, a second terminal and a common terminal, which comprises:

a first current path extending between said first terminal and said common terminal and comprising the series connection of a current source and the collector-emitter path of a first bipolar transistor, said current source being connected to said collector-emitter path at a first junction;

a second current path extending between said second terminal and said common terminal and comprising the collector-emitter path of a second bipolar transistor, said first and second transistors being of the same conductivity type and their base electrodes being connected together at a second junction;

a third transistor of opposite conductivity type to that of said first and second transistors and connected as an emitter follower between said common terminal and said second junction to control said base electrodes;

an impedance element for coupling the base electrode of said third transistor to said common terminal; and feedback loop means coupled between said first junction and the base electrode of said third transistor for controlling the base voltage of said third transistor so that in operation the collector current of said first transistor is substantially equal to the current from said current source.

2. A current source circuit arrangement as claimed in claim 1, characterized in that the control loop comprises a fourth and a fifth transistor which are connected as a differential amplifier, the base electrode of the fourth transistor being coupled to the first junction, the base electrode of the fifth transistor being connected to a reference voltage and the impedance element being coupled to the collector lead of the fifth transistor.

3. A current source circuit arrangement as claimed in claim 2, characterized in that the fourth and the fifth transistor are of opposite conductivity types, the fifth transistor being of the same conductivity type as the third transistor.

4. A current source circuit arrangement as claimed in claim 1, characterized in that the emitter leads of the first and second transistors are each coupled through a resistor to the common terminal, and in that the control loop is connected between the collector of the first transistor and the second junction at the base electrodes of the first and second transistors.

5. A current source circuit arrangement as claimed in claim 4, characterized in that the control loop comprises a fourth transistor whose base electrode is coupled to the collector of the first transistor and whose emitter is coupled to the base electrode of said third transistor.

* * * * *